United States Patent [19]
Kang

[11] Patent Number: 5,958,080
[45] Date of Patent: Sep. 28, 1999

[54] METHOD AND APPARATUS FOR DETECTING AND RECOVERING FROM ERRORS OCCURRING IN A TRANSMISSION OF DIGITAL INFORMATION

[75] Inventor: Sung-Min Kang, Seoul, Rep. of Korea

[73] Assignee: SamSung Electronics Co., Ltd., Suwon, Rep. of Korea

[21] Appl. No.: 08/854,722

[22] Filed: May 12, 1997

[30] Foreign Application Priority Data

May 10, 1996 [KR] Rep. of Korea ...................... 96-15490

[51] Int. Cl.⁶ ............................ G06F 11/10; H03M 13/00
[52] U.S. Cl. ........................... 714/807; 714/799; 714/808
[58] Field of Search ................................ 371/53, 54, 48; 714/807, 799, 808

[56] References Cited

U.S. PATENT DOCUMENTS

| | | |
|---|---|---|
| 4,074,232 | 2/1978 | Otomo et al. . |
| 4,377,862 | 3/1983 | Koford et al. . |
| 4,439,859 | 3/1984 | Donnan . |
| 5,007,054 | 4/1991 | Lee et al. . |
| 5,210,751 | 5/1993 | Onoe et al. . |
| 5,247,524 | 9/1993 | Callon . |
| 5,430,738 | 7/1995 | Tsuda . |
| 5,506,958 | 4/1996 | Myran . |
| 5,553,083 | 9/1996 | Miller . |
| 5,577,046 | 11/1996 | Diachina et al. . |
| 5,638,360 | 6/1997 | Sugawara ................................. 370/253 |

*Primary Examiner*—Phung M. Chung
*Attorney, Agent, or Firm*—Robert E. Bushnell, Esq.

[57] ABSTRACT

A method of detecting errors and losses in transmitting digital information from a sending unit to a receiving unit, including the steps of: receiving header information indicating the transmission size from the sending unit at an early stage of the transmission process; counting the number of pieces of information transmitted while receiving the information; and comparing the result of the counting step with the size indicated in the header information. In one embodiment of the invention, the method is adapted for use with transmissions of information from an upper processor to a lower processor in a digital cellular system base station.

49 Claims, 4 Drawing Sheets

METHOD AND APPARATUS FOR DETECTING AND RECOVERING FROM ERRORS OCCURRING IN A TRANSMISSION OF DIGITAL INFORMATION

CLAIM OF PRIORITY

This application makes reference to, incorporates the same herein, and claims all benefits accruing under 35 U.S.C. §119 from an application for METHOD OF DETECTING A LOADING ERROR OCCURRING IN A BASE STATION OF DIGITAL CELLULAR SYSTEM earlier filed in the Korean Industrial Property Office on the $10^{th}$ day of May 1996 and there duly assigned Ser. No. 15490/1996, a copy of which application is annexed hereto.

BACKGROUND OF THE INVENTION

1. Field of the Invention

This invention relates to transmissions of digital information between a sending unit and a receiving unit, and more particularly, to methods of detecting and recovering from errors in transmitting digital information from a sending unit to a receiving unit and to methods of detecting transmission errors between an upper processor and a lower processor in a base station of a digital cellular system.

2. Description of the Related Art

Errors can occur in a transmission of digital information from a sending unit to a receiving unit. Such errors occur in two types: errors in which a part of the information transmitted is not received, i.e., information losses, and errors consisting in corruption of information during the transmission process. In what follows, an error of the second or "corruption" type will be referred to as an error, while an error of the first type will be referred to as missed information or a loss of information.

Various methods are well known for detecting and compensating for errors and losses in the transmission of digital information. These methods generally address error detection and correction in specific contexts and therefore include inherent limitations that prevent them from being suitable for a wider range of fields of application. For example, U.S. Pat. No. 5,007,054, entitled "Network and Protocol for Real-Time Control of Machine Operations" and granted to Lee et al., discloses a communication network for connecting microprocessor controllers in a mail processing system. Each message sent between microprocessors comprises a message word count followed by uninterrupted message data. A receiving microprocessor sends back a positive acknowledgment word when it detects that the message is error-free and has as many words as indicated by the message word count sent initially. A known arithmetic checksum method is used to check for errors. The receiving microprocessor sends a negative acknowledgment to indicate missing words or errors, and the sending microprocessor responds by retransmitting the entire message.

The efficiency of this system benefits from the fact that a receiving unit only transmits an acknowledgment after the entire message has been transmitted. On the other hand, the messages involved are short: no more than 33 words in length. In systems with higher-level communications, messages are typically longer and division into packets often occurs, retransmission of an entire message is impractical. Moreover, where both sending and receiving units have significant processing capabilities, greater efficiency could be realized by a fuller integration of the two units in the error-checking process.

A frequently-used approach to detecting errors in digital transmissions involves computation of checksums. Such computation typically produces one or more checksum values by adding together the numerical values of the words in a unit of information. The unit is checked for errors after transmission by re-summing the words along with the checksum values, in any of various well-known procedures. The process of producing and using checksums to perform error checking can itself require significant computational resources. Different approaches have been suggested for generating checksums. For example, U.S. Pat. No. 5,247,524, entitled "Method for Generating a Checksum" and granted to Callon, discloses a method for computing a checksum for a bit string in a data packet. The method involves grouping the bit string into contiguous groups and sequentially producing a checksum component for each group. A final checksum for the entire bit string is computed as an accumulation of the checksum components.

Callon'524 thus shows an interesting alternative approach to computing checksums. Using checksums for error checking, though, also requires checking a data unit against an associated checksum after transmission. It would be desirable to have an error checking method that requires less overhead in the combined process of producing checksums and checking for errors with them. Ideally, such a method would make use of other information produced otherwise to carry out the transmission in further reducing the computational overhead.

U.S. Pat. No. 5,506,958, entitled "Error Detection for Parallel Data Transfer Between a Processor and a Peripheral Device by Comparing Registers Storing a Sum of Values in Bytes of Data Transferred" and granted to Myran, provides an approach for performing error checking that allows increased data transfer rates. This reference discloses a method and apparatus for detecting errors in data transfer between a computer and a peripheral device such as a printer. The transmission occurs through an interface port that includes a FIFO DRAM buffer and a memory location for a checksum. Before transferring a block of data to the FIFO DRAM, the computer initializes an internal checksum variable and the interface checksum to the same initial value, typically zero. As each word of data is transferred, the computer adds to the internal checksum variable the value of the word as transmitted and adds to the interface checksum the value of the word as received. When the entire block has been transmitted, the computer compares the two checksum values: equal values means no transmission error, while unequal values means an error occurred.

This system concurrently accumulates checksums for a message both as transmitted and as received, thus utilizing hardware parallelism to mitigate the error checking bottleneck. However, it does not overcome the need to compute checksums for both ends of the communication channel. Also, because the computer must carry out the accumulation procedure for both checksum values, the Myran procedure still entails two serial calculations.

Information losses present a related and persistent problem that requires remediation for reliable high speed digital information transmission. Like error recovery, a first step in remediating partial information loss consists in determining that such a loss has occurred. U.S. Pat. No. 5,577,046, entitled "Automatic Information Request" and granted to Diachina et al., provides one approach for detecting information loss. This reference shows a method for a cellular telephone system base station to obtain from a mobile station a report of the status of the individual packets comprising a message sent from the base station to the mobile station. The base station sends the message as a sequence of packets and also sends a polling request directing the mobile station to send information on the packets it has received without error. The mobile station responds by sending a bit map with length corresponding to the number of packets in the message (up to a maximum of 32). Each bit in the bit map corresponds to a packet in the message previously sent by the base station, and the values of the bits indicate RECEIVED or NOT RECEIVED according to whether the mobile station received the corresponding packet without errors.

The Diachina base station configuration provides for polling requests to be sent before an entire message has been transmitted, which necessarily adds to the overhead from loss detection by requiring several loss determination procedures. Moreover, in this system the bit map serves only as a format for communicating message packet status to the base station, rather than as a means by which the mobile station determines that it needs retransmission of certain packets. In fact, the determination that some packets must be retransmitted, and which ones, occurs at the base station, not the mobile station. Also, this system does not adapt its response to different levels of information loss severity.

I have found that a need exists for a method for increasing the integrity of digital transmissions while requiring minimal additional system resources and maintaining high data transfer rates. This method should be suitable for use with high-level communication systems using packetized data transfer. Desirably, such a method would also reduce redundancy in error checking calculations and loss detection procedures. Ideally, such a method would utilize hardware parallelism to reduce overhead and would have automatic adaptation to the severity of disruption incurred in a transmission.

SUMMARY OF THE INVENTION

The objectives and features of the present invention will be discussed in detail with reference to an embodiment for transmissions between processors in a digital cellular telephone base station. However, the method of this invention applies to a wide range of digital communications applications.

An objective of the present invention is to provide a method and device for detecting errors and information losses that can occur when information is transmitted from an upper processor to a lower processor in a digital cellular system base station.

Another objective of the present invention is to provide a method of detecting and recovering from transmission errors and information losses in a digital communication system, wherein the method reduces computational and procedural redundancy, utilizes hardware parallelism that exists in the involved system, operates successfully in a packetized transfer environment, and provides automatic adaptation to the severity of transmission disruption.

To achieve these and other objectives of this invention, a method is provided for detecting errors which result from problems in communication lines and other factors during transmission within a digital cellular system base station.

Accordingly, a first aspect of the present invention provides a method of transmission of an amount of digital information from a sending unit to a receiving unit. The method includes receiving header information during an early stage of the transmission. The header information indicates a size value that represents the size of the information amount to be transferred. Another step in the method is accumulating a measure of a first quantity of information that was received during the transmission. A detecting step detects occurrence of losses in the transmission by comparing the size value with the measure of the first quantity, and an indicating step indicates whether a second quantity of information was lost in the transmission, in accordance with the result of the comparing step.

This first aspect of the invention can also include the case where the first quantity of information, or the first and the second quantities both, are pieces of information such as packets. In this case, the measure of the first quantity of information is a count of the pieces in the first quantity. If the first and the second quantities are both in pieces, then the size value is the cardinal number of pieces in the first and second quantities together. In this case, the indicating step indicates that information was lost when the count does not equal the size value. The method can also include retransmitting at least a portion of the amount of digital information when the size value exceeds the count. This retransmission can proceed by retransmitting the entirety of the amount of digital information originally transmitted, if the size value exceeds the count by at least a predetermined value. Or, it can proceed by retransmitting information corresponding to the pieces of information lost, if the size value does not exceed the count by at least the predetermined value. In a preferred embodiment, the predetermined value is 50.

In the case that both the information received and any information lost was in pieces of information, the method also provides for a sequence number to be included in each of those pieces of information. Each sequence number indicates the position of the piece in which it is included within the amount of digital information that was transmitted. In this case, the method includes the steps of initializing a signal check table in a storage location in communication with the receiving unit. The signal check table includes a table position corresponding to each sequence number included in a piece of information in the amount of information transmitted. The method also includes marking the table position corresponding to the sequence number of a received piece of information when that piece is received, thereby indicating that the piece was received. In this case the method further includes the step of determining the count from the signal check table after the entire amount of digital information has been transmitted.

In another embodiment of the invention, an information transmitting device is provided that includes an information receiver for receiving header information during an early stage of a transmission of a first physical quantity representing an amount of digital information from a sending unit to a receiving unit, with the header information indicating a size value representing a size of the amount; an accumulator for accumulating first signals representative of a measure of a first quantity of information received during said transmission; and an indicator for indicating that a second quantity of information was lost during the transmission whenever the size value does not correspond to the measure. This device can further include a retransmitter for retransmitting a second physical quantity representing at least a portion of the amount of digital information when the size value does not correspond to the measure. The first quantity of information can include first pieces of information and the second quantity of information can correspond to second pieces of information, where both first and second pieces of information were included in the amount of digital information, in which case the measure is a count of the first pieces of information and the size value is the cardinal number of a set including both the first and second pieces of information. The device may also include a discriminator that receives the size value and the count and generates second signals indicative of whether the size value exceeds the count by at least a predetermined amount. Also, the discriminator can be coupled to the retransmitter and the retransmitter can receive the second signals. In this case, the second physical quantity represents the entirety of the amount of digital information when the size value exceeds the count by at least the predetermined value, and it represents information corresponding to said second pieces of information when the size value does not exceed the count by at least the predetermined value.

The first and second pieces of information can also each include a sequence number indicating the position of the piece in the amount of digital data. In this case, the device can further include a storage element, in communication with the receiving unit, for storing a signal check table having a table position corresponding to each of the sequence numbers. Also, the device can have a marker for storing a marker character in the table position corresponding to the sequence number of each of the first pieces of information when the piece is received, which allows the signal check table to indicate that the piece was received. A reader can also be included that determines the count by reading the signal check table after all of the amount of digital information has been transmitted and accumulating digits to indicate the count.

In a further embodiment of the invention, the method also includes a step of determining whether one or more of the received pieces of information contain errors (i.e., were corrupted in the process of transmission). This error determination step can include the case where the header information includes a total checksum corresponding to the information in all the pieces of information, both received and not received, and where each those pieces of information includes a piece checksum corresponding to that piece. In this case the error determining step includes computing a computed checksum by summing (i.e., adding together) all of the piece checksums from the received pieces of information and comparing the computed checksum with the total checksum. The method then further includes a step of indicating that one or more of the received pieces of information contain errors, in accordance with the result of the checksum comparing step. In this case the method also includes the step of retransmitting the entirety of the amount of digital information originally transmitted when the checksum comparison step indicates that an error is contained in one or more of the received pieces of information.

According to the another aspect of the present invention, a method of detecting errors in transmitting information from an upper processor in a digital cellular system base station is provided. The method includes the steps of receiving header information indicating a size value that indicates a size of a transmission at an early stage of loading the transmission; counting the number of pieces of information received from the transmission while loading the information; and comparing the size value to the result of the counting step. The method can further include the step of retransmitting at least a portion of the information when a loss occurred (i.e., a piece of information was lost) during the loading of the information. The method in this case can also include the step of determining whether the number of pieces lost exceeds at least a predetermined value. In this case the method also includes retransmitting the entirety of the information when the number exceeds the predetermined value and retransmitting information corresponding to the missed pieces (i.e., the pieces that were lost) when the number does not exceed the predetermined value.

According to a further aspect of the present invention, a method of detecting errors in loading information from an upper processor in a digital cellular system base station includes the steps of dividing information into pieces of a predetermined size; including in each of the pieces a piece checksum corresponding to the piece; transmitting the pieces from the upper processor to a lower processor; computing a total checksum by summing all of the piece checksums; computing a computed checksum by summing the piece checksums included in the pieces received by the lower processor; and comparing the computed checksum with the total checksum. The method can also include retransmitting the entirety of the information when the computed checksum does not equal the total checksum.

According to still another aspect of the present invention, a method of detecting errors in an operation of loading information from an upper processor in a digital cellular system base station, wherein the information is divided into a plurality of packets, comprises the steps of receiving header information at an early stage of the operation, wherein the header information indicates a sent packet count corresponding to the number of packets in the plurality of packets; calculating for each packet a packet checksum corresponding to the packet; including in each packet the packet checksum corresponding to the packet and a packet sequence number corresponding to the position of the packet in the information; calculating a total checksum by summing all of the packet checksums; transmitting the plurality of packets to a lower processor; marking, for each packet received by the lower processor, a table position in a signal check table, wherein the table position corresponds to the packet sequence number included in the received packet; computing a computed checksum by summing all of the packet checksums from the packets received by the lower processor; determining a received packet count, corresponding to the number of packets received by the lower processor in the loading operation, by reference to the signal check table; comparing the received packet count with the sent packet count; and retransmitting the entirety of the plurality of packets when the computed checksum does not equal the total checksum.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE PREFERRED EMBODIMENT(S)

Figure 1:
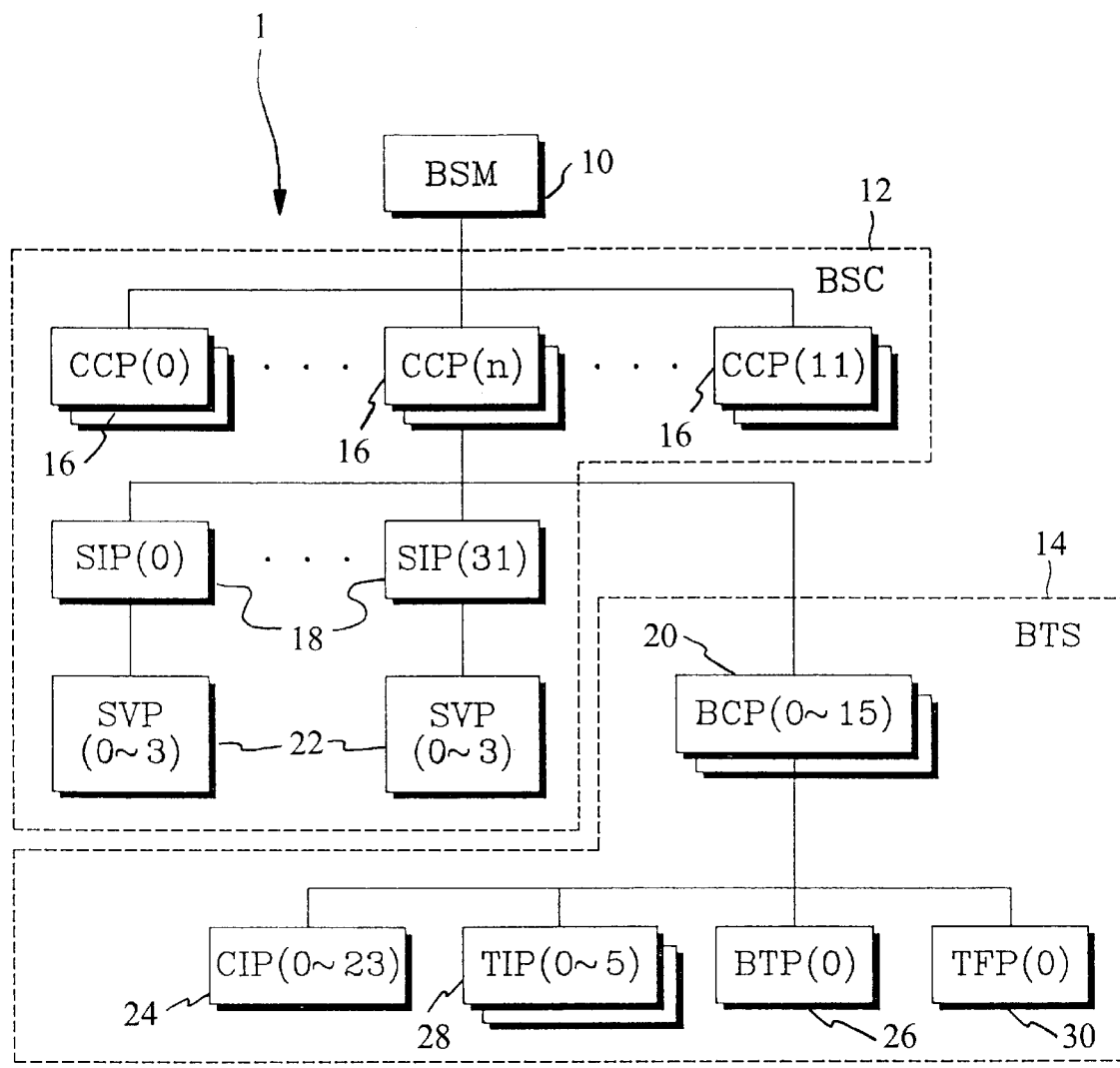
FIG. 1 illustrates a configuration of a digital cellular system according to the present invention.

A digital cellular system is composed of a base station 1 (BSS), a mobile switching center (MSC) (not shown), and a home location register (HLR) (not shown). As shown in FIG. 1, a BSS 1 consists of a base station manager 10 (BSM), a base station controller 12 (BSC), and a base station transceiver subsystem 14 (BTS).

FIG. 1 shows the hierarchical processor arrangement in a typical BSS 1. Referring to FIG. 1, a typical system contains one BSM 10 which is composed of work stations (not shown). The BSM loads call control processors 16 (CCPs). The BSC 12 is equipped with a maximum of twelve CCPs 16. One CCP 16 can load a maximum of thirty-two selector interface processors 18 (SIPs) and a maximum of sixteen BTS control processors 20 (BCPs). Therefore the BSS 1 is equipped with a maximum of three hundred eighty four SIPs 18. One SEP 18 can load a maximum of four selector vocoder processors 22 (SVP). The BSS 1 is equipped with a maximum of one hundred ninety two BCPs 20. One BCP 20 loads a maximum of twenty four control inter-working processors 24 (CIP), one BTS test processor 26 (BTP), six pairs of transceiver interface processors 28 (TIP), and one pair of time and frequency processors 30 (TFP).

FIG. 1 also illustrates a loading operation executed in BSS of a digital cellular system. The BSS has a hierarchical structure made up of upper, intermediate, and lower processors. An intermediate processor, such as a CCP 16, an SIP 18, or a BCP 20, receives its programs and data from an upper processor, such as a BSM 10 or a CCP 16, through a loading operation. The intermediate processor also stores programs and data which are loaded from an upper processor and loads them into low processors during the execution of an application. If a lower processor requires loading by an intermediate processor, the intermediate processor receives and stores the program or data and then loads it into the lower processor. Note an intermediate processor such as a CCP 16 can play the role of an upper processor for processors on lower levels of the hierarchical structure, and it can also play the role of a lower processor with respect to processors on a higher level of the hierarchy.

This information transfer is established through physical communication channels, and as a consequence external interference or other factors can cause information losses or errors in the loading operation.

Referring to the attached drawings, a preferred embodiment of the present invention is described in detail.

Where concrete explanations of well-known functions or configurations can obscure the features and advantages of this invention, a detailed description will be omitted. Moreover, various terms used in the following description will be defined specifically, and these terms can differ from the meanings given to such term by persons other than the present applicant.

Figures 2A, 2B:
FIGS. 2A and 2B together form an illustration for explaining a loading error detection method according to the present invention.
Figures 3A, 3B:
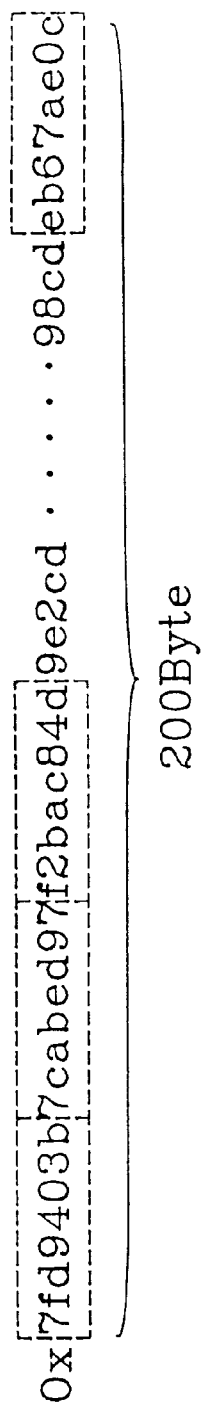
FIGS. 3A and 3B together form an illustration for explaining another loading error detection method according to the present invention.
Figure 4:
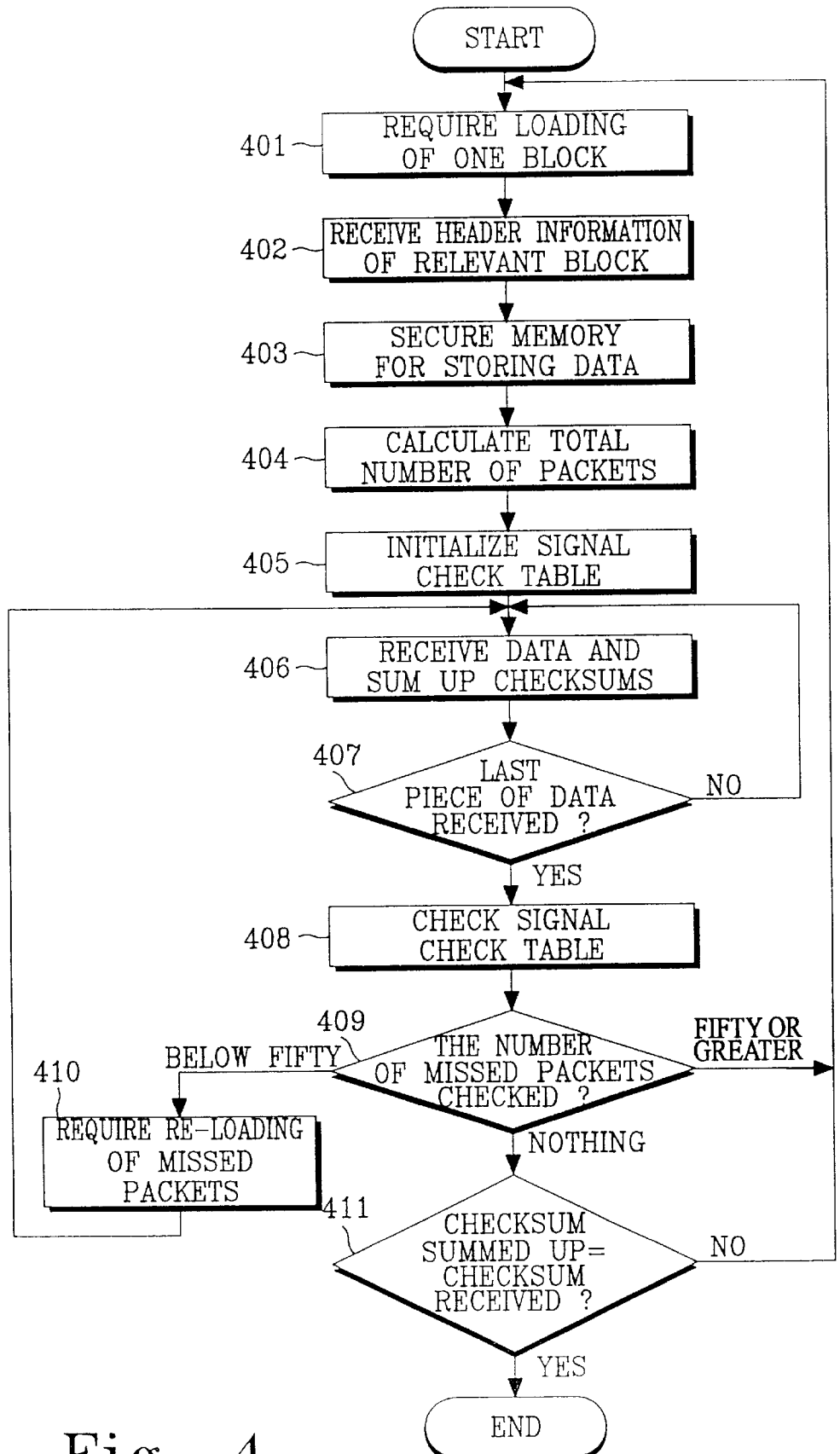
FIG. 4 is a flow chart of detection of a loading error according to the present invention.

The present invention provides a method of detecting loading errors and losses that can occur in a transmission between an upper processor to a lower processor in a digital cellular system base station. The present invention employs a signal check table and checksums for detecting loading errors. FIGS. 2A and 2B show a loading error detection method using a signal check table. FIGS. 3A and 3B show a loading error detection method using the checksum.

With reference to FIGS. 2A and 2B, the operation of detecting loading errors with a signal check table is described. The size of the transmission is limited by the characteristics of the system, so that where the program or data has a large size it must be divided into packets before being sent. Packet size is determined by the convention that exists for communication between the processors involved. A possible packet size is 200 bytes. The upper processor sends the size of the program or data to the lower processor by means of a header, which contains information required by the lower processor. This occurs at an early stage of the loading operation. The lower processor creates a signal check table in memory and initializes it to zero, as shown in FIGS. 2A and 2B. The lower processor calculates the total number of packets by dividing the size value sent in the header information from the upper processor by the packet size of, for example, 200 bytes.

The upper processor counts the data into packets of, for example, 200 bytes each and labels the packets with sequence numbers, i.e., 0, 1, 2, 3, and so forth. The upper processor at a later stage then sends the data to the lower processor. Whenever it receives a packet, the lower processor marks a "1" in the table position corresponding to the sequence number of the packet and stores the packet in memory. If the lower processor receives a message from the upper processor that the transmission is complete, then the lower processor identifies "losses" or missed packets, i.e., packets sent but not received, by referring to the signal check table for table positions not marked with "1." If the number of missed packets is less than a predetermined value, then the lower processor requests the upper processor to retransmit the missed packets. If a number of missed packets equals or exceeds the predetermined value, then the lower processor requests the upper processor to retransmit the entire transmission. In a preferred embodiment, the predetermined value is 50.

If the packet size is 200 bytes and total number of packets for loading is 50, then the upper processor can divide each 200 bytes into bundles of four bytes and sum and store a number of four-byte bundles before sending each packet. In any case, the upper processor computes a packet checksum for each packet and includes it in the packet. After sending the last (50th) packet, the upper processor sends a total checksum, which is the result of summing the packet checksums for all of the packets, to the lower processor. The lower processor computes a computed checksum by summing the packet checksums received with the packets from the upper processor. After receiving the total checksum calculated by the upper processor, the lower processor compares the computed checksum with the total checksum to detect errors. An example of calculating a checksum is illustrated in FIGS. 3A and 3B. The illustration of FIG. 3A shows a packet. FIG. 3B shows the checksum for the packet of FIG. 3A.

Referring FIGS. 2A through 4, the operation of detecting loading errors and losses using the signal check table and checksum is described. When a lower processor requires loading of a block of data or program instructions (step 401), the upper processor sends header information for the block. The header information indicates the size of the block. When the lower processor receives the header information (step 402), it sends an acknowledgment (ACK) message to the upper processor and allocates memory according to the size of the block (step 403). The lower processor then computes the number of packets (step 404) in accordance with the header information and the packet size. The lower processor initializes the signal check table to "0" (step 405) before receiving the packets. The lower processor sums the packet checksums received from the upper processor with the packets and marks "1" at a corresponding table position in the signal check table and writes the data in the secured memory (step 406). When the lower processor receives a signal indicating that a current received packet is the last in the block (step 407), then the lower processor checks the signal table (step 408) and calculates the number of packets that were missed by identifying table positions that were not marked "1" (step 409). If the number of missed packets is less than 50, the lower processor requests that the upper processor retransmit the missed packets (step 410). If the number of missed packets is 50 or greater, the lower processor requests that the upper processor retransmit the entire block, returning back to step 401.

The procedure continues to step 411 after these checks, if there were no missed packets. The lower processor receives a total checksum calculated by the upper processor following reception of the last packet from the upper processor. In step 411 the lower processor compares the total checksum from the upper processor with the computed checksum which the lower processor computed as it received the packets. Where the two checksums are not equal, the lower processor requires the upper processor to retransmit the entire block.

As described above, the present invention detects transmission errors and losses between an upper processor and a lower processor in a digital cellular system base station, using a signal check table and checksums. The lower processor requires the upper processor to retransmit the data when errors are detected, thereby ensuring that data is completely and accurately received.

It should be understood that the present invention is not limited to the particular embodiment disclosed herein as a preferred embodiment, and neither is the present invention limited to the specific embodiments described in this specification, except as defined in the appended claims.

What is claimed is:

1. A method of transmitting digital information, comprising the steps of:
   receiving from a sending unit at a receiving unit header information during an early stage of transmission for digital information, said header information including a physical quantity representing an amount of said digital information, with said header information indicating a size value representing a size of said amount of said digital information;
   accumulating a measure of a first quantity of information of said digital information received at said receiving unit during a later stage of said transmission, wherein said first quantity of information of said digital information includes first pieces of information, and said measure of said first quantity of information of said digital information is a count of said first pieces of information;
   detecting occurrence of losses in said later stage of said transmission by comparing said size value to said measure of said first quantity of information of said digital information; and
   indicating that a second quantity of information of said digital information was lost during said later stage of said transmission whenever said size value does not correspond to said measure of said first quantity of information of said digital information, wherein said second quantity of information of said digital information corresponds to second pieces of information included in said amount of digital information, and said size value corresponds to said count of said first pieces of information when said size value equals said count of said first pieces of information.

2. The method of claim 1, wherein
   a set including said first pieces of information and said second pieces of information has a cardinal number, and said size value represents said cardinal number.

3. The method of claim 2, further comprising the step of retransmitting at least a portion of said amount of said digital information when said size value exceeds said count of said first pieces of information.

4. The method of claim 3, further comprising the step of determining whether said size value exceeds said count of said first pieces of information by a predetermined value when said size value does not equal said count of said first pieces of information.

5. The method of claim 4, wherein said step of retransmitting includes:
   retransmitting an entirety of said amount of said digital information when said size value exceeds said count of said first pieces of information by at least said predetermined value; and
   retransmitting information corresponding to said second pieces of information when said size value does not exceed said count of said first pieces of information by at least said predetermined value.

6. The method of claim 5, wherein each one of said first pieces of information and said second pieces of information includes a sequence number, each said sequence number indicating a respective position of a corresponding one of said first pieces of information and said second pieces of information in said amount of said digital information, and further comprising the steps of:
   initializing a signal check table at a storage location in communication with said receiving unit and said signal check table having a table position corresponding to each said sequence number;
   marking one said table position corresponding to one said sequence number when each one of said first pieces of information is received to indicate that a corresponding one of said first pieces of information was received; and
   determining said count of said first pieces of information by checking said signal check table after all of said amount of said digital information has been transmitted.

7. The method of claim 6, wherein said predetermined value is not greater than 200.

8. The method of claim 2, wherein each one of said first pieces of information and said second pieces of information includes a sequence number, each said sequence number indicating a respective position of a corresponding one of said first pieces of information and said second pieces of information in said amount of said digital information, and further comprising the steps of:
   initializing a signal check table at a storage location in communication with said receiving unit and said signal check table having a table position corresponding to each said sequence number;
   marking one said table position corresponding to one said sequence number when each one of said first pieces of information is received to indicate that a corresponding one of said first pieces of information was received; and
   determining said count of said first pieces of information by checking said signal check table after all of said amount of said digital information has been transmitted.

9. The method of claim 2, further comprising an error determining step of determining whether at least one of said first pieces of information contains error.

10. The method of claim 9, wherein:
    said header information includes a total checksum corresponding to said set,
    each one of said first pieces of information and said second pieces of information includes a correspond piece checksum, and said error determining step includes:

computing a computed checksum by summing each said piece checksum included in said first pieces of information, comparing said computed checksum with said total checksum, and indicating that at least one of said first pieces of information contains error when said computed checksum does not equal said total checksum.

11. The method of claim 10, further comprising the step of retransmitting an entirety of said amount of said digital information when said error determining step indicates that at least one of said first pieces of information contains error.

12. The method of claim 9, further comprising the step of retransmitting an entirety of said amount of said digital information when said error determining step indicates that at least one of said first pieces of information contains error.

13. The method of claim 3, wherein each one of said first pieces of information and said second pieces of information includes a sequence number, each said sequence number indicating a respective position of a corresponding one of said first pieces of information and said second pieces of information in said amount of said digital information, and further comprising the steps of:

initializing a signal check table at a storage location in communication with said receiving unit and said signal check table having a table position corresponding to each said sequence number;

marking one said table position corresponding to one said sequence number when each one of said first pieces of information is received to indicate that a corresponding one of said first pieces of information was received; and determining said count of said first pieces of information by checking said signal check table after all of said amount of said digital information has been transmitted.

14. The method of claim 3, further comprising an error determining step of determining whether at least one of said first pieces of information contains error.

15. The method of claim 14, wherein:

said header information includes a total checksum corresponding to said set, each one of said first pieces of information and said second pieces of information includes a corresponding piece checksum, and said error determining step includes:

computing a computed checksum by summing each said piece checksum included in said first pieces of information, comparing said computed checksum with said total checksum, and indicating that at least one of said first pieces of information contains error when said computed checksum does not equal said total checksum.

16. The method of claim 15, further comprising the step of retransmitting an entirety of said amount of said digital information when said error determining step indicates that at least one of said first pieces of information contains error.

17. The method of claim 14, further comprising the step of retransmitting an entirety of said amount of said digital information when said error determining step indicates that at least one of said first pieces of information contains error.

18. The method of claim 4, wherein each one of said first pieces of information and said second pieces of information includes a sequence number, each said sequence number indicating a respective position of a corresponding one of said first pieces of information and said second pieces of information in said amount of a digital information, and further comprising the steps of:

initializing a signal check table at a storage location in communication with said receiving unit and said signal check table having a table position corresponding to each said sequence number;

marking o said table position corresponding to one said sequence number when each one of said first pieces of information is received to indicate that a corresponding one of said first pieces of information was received; and determining said count of said first pieces of information by checking said signal check table after all of said amount of said digital information has been transmitted.

19. The method of claim 18, wherein said predetermined value is not greater than 200.

20. The method of claim 18, wherein said predetermined value is p such that $25 \leq p \leq 75$.

21. The method of claim 4, wherein said predetermined value is not greater than 200.

22. The method of claim 4, wherein said predetermined value is p such that $25 \leq p \leq 75$.

23. The method of claim 5, wherein said predetermined value is not greater than 200.

24. The method of claim 5, wherein said predetermined value is p such that $25 \leq p \leq 75$.

25. The method of claim 5, further comprising an error determining step of determining whether at least one of said first pieces of information contains error.

26. The method of claim 25, wherein:

said header information includes a total checksum corresponding to said set, each one of said first pieces of information and said second pieces of information includes a corresponding piece checksum, and said error determining step includes:

computing a computed checksum by summing each said piece checksum included in said first pieces of information, comparing said computed checksum with said total checksum, and indicating that at least one of said first pieces of information contains error when said computed checksum does not equal said total checksum.

27. The method of claim 26, further comprising the step of retransmitting said entirety of said amount of said digital information when said error determining step indicates that at least one of said first pieces of information contains error.

28. The method of claim 25, further comprising the step of retransmitting said entirety of said amount of said digital information when said error determining step indicates that at least one of said first pieces of information contains error.

29. The method of claim 6, wherein said predetermined value is p such that $25 \leq p \leq 75$.

30. The method of claim 6, further comprising an error determining step of determining whether at least one of said first pieces of information contains error.

31. The method of claim 30, wherein;

said header information includes a total checksum corresponding to said set, each one of said first pieces of information and said second pieces of information includes a corresponding piece checksum, and said error determining step includes;

computing a computed checksum by summing each said piece checksum included in said first pieces of information, comparing said computed checksum with said total checksum, and indicating that at least one of said first pieces of information contains error when said computed checksum does not equal said total checksum.

32. The method of claim 31, further comprising the step of retransmitting said entirety of said amount of said digital information when said error determining step indicates that at least one of said first pieces of information contains error.

33. The method of claim 30, further comprising the step of retransmitting said entirety of said amount of said digital information when said error determining step indicates that at least one of said first pieces of information contains error.

34. The method of claim 1, further comprising the step of retransmitting at least a portion of said amount of said digital information when said size value does not correspond to said measure of said first quantity of information of said digital information.

35. The method of claim 1, further comprising the step of retransmitting at least a portion of said amount of said digital information when said size value does not correspond to said count of said first pieces of information.

36. The method of claim 1, further comprising an error determining step of determining whether at least one of said first pieces of information contains error.

37. The method of claim 36, further comprising the step of retransmitting an entirety of said amount of said digital information when said error determining step indicates that at least one of said first pieces of information contains error.

38. An information transmitting device, comprising:

a receiving unit including an information receiver for receiving header information from a sending unit during an early stage of a transmission for digital information, said header information including a first physical quantity representing an amount of said digital information to be transmitted from said sending unit to said receiving unit, with said header information indicating a size value representing a size of said amount of said digital information;

an accumulator for accumulating first signals representative of a measure of a first quantity of information of said digital information received during a later stage of said transmission, wherein said first quantity of information of said digital information includes first pieces of information, and said measure of said first quantity of information of said digital information is a count of said first pieces of information;

a detector for detecting losses in said digital information in said later stage of said transmission by comparing said size value to said measure of said first quantity of information of said digital information; and an indicator for indicating that a second quantity of information of said digital information was lost during said later stage of said transmission whenever said size value does not correspond to said measure of said first quantity of information of said digital information, wherein said second quantity of information of said digital information corresponds to second pieces of information included in said amount of said digital information, and said size value corresponds to said count of said first pieces of information when said size value equals said count of said first pieces of information.

39. The information transmitting device of claim 38, further comprising:

a retransmitter for retransmitting a second physical quantity representing at least a portion of said amount of said digital information when said size value does not correspond to said measure of said first quantity of information of said digital information.

40. The information transmitting device of claim 39, wherein:

a set including said first pieces of information and said second pieces of information has a cardinal number, and said size value represents said cardinal number.

41. The information transmitting device of claim 40, further comprising:

a discriminator, coupled to said retransmitter, for receiving said size value and said count of said first pieces of information and for generating second signals indicating whether said size value exceeds said count of said first pieces of information by at least a predetermined value; and wherein said retransmitter retransmits said second physical quantity in response to said second signals, and wherein said second physical quantity represents an entirety of said amount of said digital information when said second signals indicate that said size value exceeds said count of said first pieces of information by at least said predetermined value, and wherein said second physical quantity represents information corresponding to said second pieces of information when said second signals indicate that said size value does not exceed said count of said first pieces of information by at least said predetermined value.

42. The information transmitting device of claim 41, wherein each one of said first pieces of information and said second pieces of information includes a sequence number, each said sequence number indicating a respective position of a corresponding one of said first pieces of information and said second pieces of information in said amount of said digital information, and further comprising:

a storage element, in communication with said receiving unit, for storing a signal check table having a table position corresponding to each said sequence number;

a marker for storing a marker character in one said table position corresponding to one said sequence number when each one of said first pieces of information is received, whereby said signal check table indicates that a corresponding one of said first pieces of information was received; and a reader for determining said count of said first pieces of information by reading said signal check table after all of said amount of said digital information has been transmitted and for accumulating digits to indicate said count of said first pieces of information.

43. A method of detecting errors in loading information from an upper processor in a digital cellular system base station, comprising the steps of:

receiving header information, said header information including a size value representing a size of an amount of digital information of a transmission for said digital information at an early stage of loading said transmission for said digital information;

counting a number of information pieces of said digital information received from said transmission for said digital information while loading said information pieces of said digital information to provide a count of said number of information pieces of said digital information received; ad comparing said size value with a result of said step of counting, wherein said size value corresponds to said count of said number of information pieces of said digital information received when said size value equals said count of said number of information pieces of said digital information received.

44. The method of claim 43, further comprising the steps of:
   determining, in accordance with an outcome of said step of comparing, whether at least one missed piece of said digital information was not received from said transmission for said digital information during loading of said digital information; and
   retransmitting at least a portion of said digital information when a loss occurred during loading of said digital information.

45. The method of claim 44, wherein said step of retransmitting includes:
   determining whether a cardinal number of a set including said at least one missed piece of said digital information exceeds at least a predetermined value,
   retransmitting an entirety of said digital information when said cardinal number exceeds said predetermined value, and
   retransmitting information corresponding to said at least one missed piece of said digital information when said cardinal number does not exceed said predetermined value.

46. A method of detecting errors in loading information, comprising the steps of:
   dividing into pieces of a predetermined size information loaded from an upper processor in a digital cellular system base station;
   including in each one of said pieces a piece checksum;
   transmitting said pieces from said upper processor to a lower processor;
   determining a total checksum by summing each said piece checksum;
   including said total checksum in a final piece transmitted to said lower processor;
   determining a computed checksum by summing each said piece checksum included in said pieces received by said lower processor; and
   comparing said computed checksum with said total checksum.

47. The method of claim 46, further comprising the step of retransmitting an entirey of said information when said computed checksum does not equal said total checksum.

48. A method of detecting errors occurring in transmission of digital information, comprising the steps of:
   receiving header information during an early stage of loading information from an upper processor in a digital cellular system base station, with said information is divided into a plurality of packets, said header information indicating a sent packet count corresponding to a cardinal number of said plurality of packets;
   determining for each packet of said plurality of packets a packet checksum;
   including in each packet of said plurality of packets a corresponding said packet checksum and a packet sequence number corresponding to a position of a respective packet of said plurality of packets in said information;
   determining a total checksum by summing each said packet checksum;
   transmitting said plurality of packets to a lower processor;
   marking, for each packet of said plurality of packets received by said lower processor, a table position in a signal check table, with said table position corresponding to said packet sequence number respectively included in each packet of said plurality of packets received;
   determining a computed checksum by summing each said packet checksum respective included in each packet of said plurality of packets received by said lower processor;
   determining from said signal check table a received packet count;
   comparing said received packet count with said sent packet count;
   retransmitting at least a portion of said plurality of packets when said received packet count does not equal said sent packet count;
   comparing said computed checksum with said total checksum; and
   retransmitting an entirety of said plurality of packets when said computed checksum does not equal said total checksum.

49. The method of claim 48, wherein said step of retransmitting when said received packet count does not equal said sent packet count includes;
   retransmitting said entirety of said plurality of packets when said sent packet count exceeds said received packet count by at least a predetermined value, and
   retransmitting each packet of said plurality of packets not received by said lower processor when said sent packet count does not exceed said received packet count by at least said predetermined value.

* * * * *